United States Patent
James-Roxby et al.

(10) Patent No.: US 11,824,564 B1
(45) Date of Patent: Nov. 21, 2023

(54) LOSSLESS COMPRESSION USING SUBNORMAL FLOATING POINT VALUES

(71) Applicant: Xilinx, Inc., San Jose, CA (US)

(72) Inventors: Philip B. James-Roxby, Longmont, CO (US); Eric F. Dellinger, Longmont, CO (US)

(73) Assignee: XILINX, INC., San Jose, CA (US)

(*) Notice: Subject to any disclaimer, the term of this patent is extended or adjusted under 35 U.S.C. 154(b) by 369 days.

(21) Appl. No.: 17/171,608

(22) Filed: Feb. 9, 2021

(51) Int. Cl.
  *H03M 7/24* (2006.01)
  *G06F 7/483* (2006.01)

(52) U.S. Cl.
  CPC .............. *H03M 7/24* (2013.01); *G06F 7/483* (2013.01)

(58) Field of Classification Search
  CPC .................................. H03M 7/24; G06F 7/483
  USPC ........................................................... 341/50
  See application file for complete search history.

(56) References Cited

U.S. PATENT DOCUMENTS

| | | | |
|---|---|---|---|
| 5,754,459 A | 5/1998 | Telikepalli | |
| 6,289,365 B1 * | 9/2001 | Steele, Jr. | G06F 7/483 708/204 |
| 6,744,388 B1 | 6/2004 | Khu | |
| 6,789,220 B1 | 9/2004 | Lovejoy | |
| 7,071,848 B1 | 7/2006 | Khu | |
| 9,660,666 B1 * | 5/2017 | Ciarlini | G06F 7/483 |
| 10,305,511 B1 | 5/2019 | Schultz et al. | |
| 10,832,123 B2 | 11/2020 | Sun et al. | |

OTHER PUBLICATIONS

Martin Isenburg et al., "Lossless Compression of Predicted Floating-Point Geometry", Elsevier Science, Jul. 10, 2004.
Peter Lindstrom et al., "Fast and Efficient Compression of Floating-Point Data", IEEE Transations of Visualization and Computer Graphics, Sep./Oct. 2006, vol. 12, No. 5.
Peter Lindstrom, "Fixed-Rate Compressed Floating-Point Arrays", IEEE Transations of Visualization and Computer Graphics, Mar. 31, 2014, published Aug. 2014.

* cited by examiner

*Primary Examiner* — Khai M Nguyen
(74) *Attorney, Agent, or Firm* — Crawford Maunu PLLC (57) ABSTRACT

A disclosed compression method includes inputting a data set of floating point values from an input circuit to a compression circuit and detecting non-zero values and sequences of zero values in the data set. The compression circuit outputs, in response to detection of a non-zero value in the data set, the non-zero value to an output circuit. The compression circuit generates, in response to detection of a sequence of zero values in the data set, a subnormal floating point value having significand bits that indicate counted zero values in the sequence, and outputs the subnormal floating point value to the output circuit.

20 Claims, 8 Drawing Sheets

LOSSLESS COMPRESSION USING SUBNORMAL FLOATING POINT VALUES

TECHNICAL FIELD

The disclosure generally relates to compression of floating point data using subnormal floating point values.

BACKGROUND

Data compression techniques remove redundancy in a data set in order to provide more efficient utilization of memory and communication channel resources. Lossless compression methods are used for data sets that require the original data to be exactly reconstructed from the compressed data stream without any loss of information. Lossy compression techniques may be suitable for applications that require less precision and/or accuracy.

Run-length encoding is a lossless compression technique in which each data element is prepended with a repetition count. For a data set having a large proportion of non-repeating data elements, the size of the data set may be doubled by run-length encoding. Sorting and binning compression techniques are alternatives to run-length encoding, but may be too slow for some applications.

SUMMARY

A disclosed circuit arrangement includes an input circuit configured to input a data set of floating point values and a detection circuit configured to detect non-zero floating point values, sequences of zero floating point values, and ends of the sequences in the data set from the input circuit. The circuit arrangement additionally includes a counter configured to count a number of zero floating point values in each sequence of zero floating point values and output the number. A formatter circuit of the arrangement is configured to provide a subnormal floating point value having significand bits that represent the number output from the counter. A selection circuit of the arrangement is configured to provide a compressed data set by selection of each non-zero floating point value for output in response to detection of the non-zero floating point value, and selection of the subnormal floating point value for output in response to an end of the ends of the sequences.

A disclosed method includes inputting a data set of floating point values from an input circuit to a compression circuit and detecting non-zero values and sequences of zero values in the data set by the compression circuit. The compression circuit outputs, in response to detection of a non-zero value in the data set, the non-zero value to an output circuit. The compression circuit generates, in response to detection of a sequence of zero values in the data set, a subnormal floating point value having significand bits that indicate counted zero values in the sequence, and outputs the subnormal floating point value to the output circuit.

Other features will be recognized from consideration of the Detailed Description and Claims, which follow.

BRIEF DESCRIPTION OF THE DRAWINGS

Various aspects and features of the circuits and methods will become apparent upon review of the following detailed description and upon reference to the drawings in which.

DETAILED DESCRIPTION

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

A floating point value is generally represented by one sign bit, N exponent bits, and M significand (or "mantissa") bits. An 8-bit exponent can represent 256 exponent values. The 8 bits of the exponent having values in the range 1-254 are mapped to a range of exponent values $2^{-126}$ to $2^{127}$. Infinity or "not a number" are signified by the 8 bits of the exponent having a value of 256. A subnormal floating point value is indicated by the exponent bits having a value 0 and a non-zero significand. Subnormal floating point values are conventionally used to represent floating point values that are less than the smallest normal floating point value, allowing representation of values between 0 and the smallest floating point value for the exponent bits having a value of 1.

In some applications, subnormal floating point values may be unused. For example, in various artificial intelligence ("AI") applications involving tensor processing, subnormal floating point values may not be present. The tensors may be large but sparse (have a large proportion of zero values). According to the disclosed approaches, subnormal floating point values are repurposed to indicate run lengths of zero values in a data set.

The reduction in the sizes of the tensor data sets not only reduces memory requirements, but can eliminate waiting by the AI engine for data to be written. As AI engines can produce data at greater rate than that data can be written to memory, reducing the data to be written by compression allows the writing of data to keep pace with output of data by the AI engine.

According to the disclosed circuits and methods, a sequence of two or more floating point zero values is compressed into a single value specified in subnormal floating point format. A data set of floating point values is input by input circuit input, and a detection circuit detects non-zero floating point values, sequences of zero floating point values, and ends of the sequences in the data set. A counter is configured to count a number of zero floating point values in each sequence of zero floating point values, and a formatter circuit provides a subnormal floating point value having significand bits that represent the number output from the counter. A selection circuit provides a compressed data set by selection of the non-zero floating point value for output in response to detection of each non-zero floating point value, and selection of the subnormal floating point value for output in response to the end of the sequence.

A memory arrangement and a decompression circuit can be provided in another embodiment. The memory arrangement can store the compressed data set provided from the compression circuitry. The decompression circuit reads the compressed data set from the memory arrangement. In response to a subnormal floating value in the compressed data set, the decompression circuit outputs a number of consecutive zero floating point values indicated by the value in the significand (and optionally the sign bit) of the subnormal floating value. In response to a normal floating point value in the data set, the decompression circuit outputs the normal floating point value.

Figure 1:
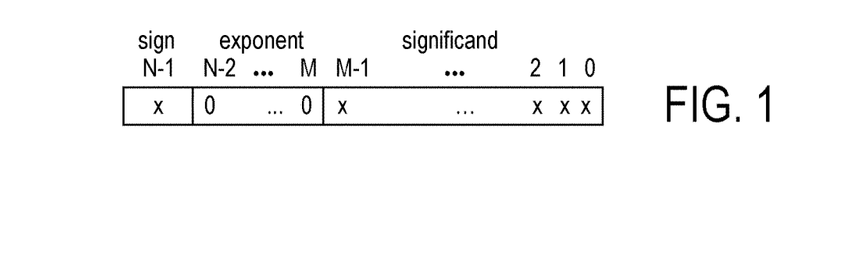
FIG. 1 shows the format of a subnormal floating point value repurposed to indicate a sequence of zero values in a compressed data set.

FIG. 1 shows the format of a subnormal floating point value repurposed to indicate a sequence of zero values in a compressed data set. The subnormal floating point value is represented by N bits, designated as bits N−1:0. The exponent bits N−2:M are all zero bits. The bits of the significand (bits M−1:0), and optionally, the sign bit (bit N−1), are used to indicate a number of consecutive more zero values.

Figure 2:
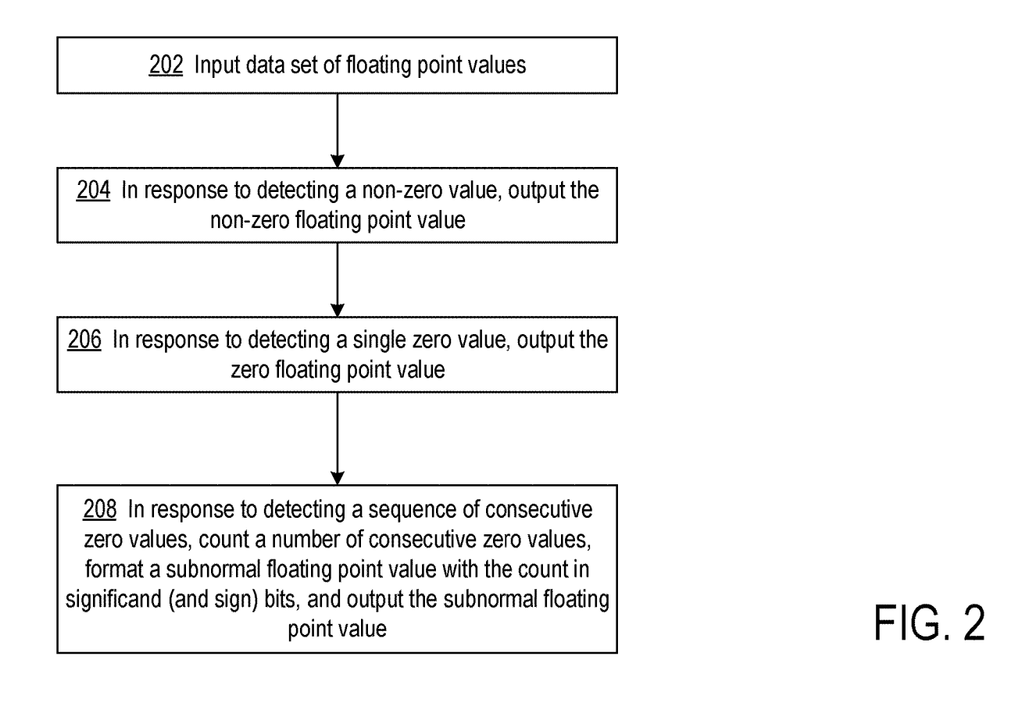
FIG. 2 is a flowchart of a process for compressing floating point data according to an exemplary approach.

FIG. 2 is a flowchart of a process for compressing floating point data according to an exemplary approach. At block 202, a compression circuit inputs an ordered data set of floating point values. The data set can be time ordered streaming input or ordered by address. At block 204, the compression circuit, in response to encountering non-zero floating point values in the data set, outputs the non-zero values.

At block 206, the compression circuit, in response to encountering single zero values in the data set, outputs normal zero floating point values (exponent and significand bits all 0). A single zero value is neither preceded nor succeeded by another consecutive zero value.

For sequences of consecutive non-zero values detected in the data set, the compression circuit at block 208 counts a number of consecutive zeros in the sequence, and formats a subnormal floating point value to specify the count. The count can be specified by the bits of the significand, or by the significand bits and sign bit.

Figure 3:
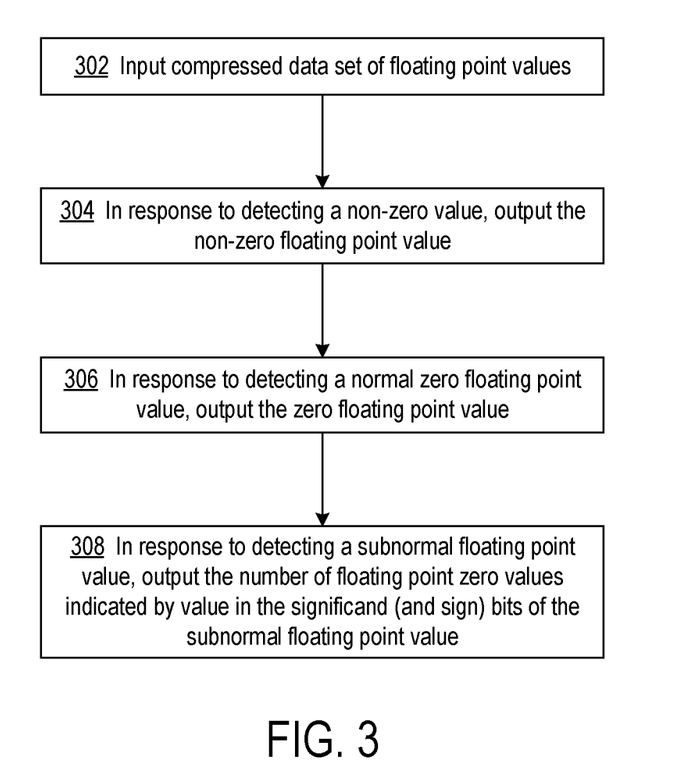
FIG. 3 is a flowchart of a process for decompressing a compressed data set of floating point values according to an exemplary approach.

FIG. 3 is a flowchart of a process for decompressing a compressed data set of floating point values according to an exemplary approach. At block 302, a decompression circuit inputs a compressed data set of floating point values. At block 304, the decompression circuit, in response to encountering non-zero floating point values in the data set, outputs the non-zero values.

At block 306, the decompression circuit, in response to encountering normal zero floating point values (exponent and significand bits all 0) in the compressed data set, outputs the zero floating point values.

In response to detecting subnormal floating point values in the compressed data set, the decompression circuit at block 308 outputs sequences of consecutive zero floating point values. The number of zero values in each sequence is indicated by the value of indicated by the significand (and optionally sign bit) of each subnormal floating point value.

Figure 4:
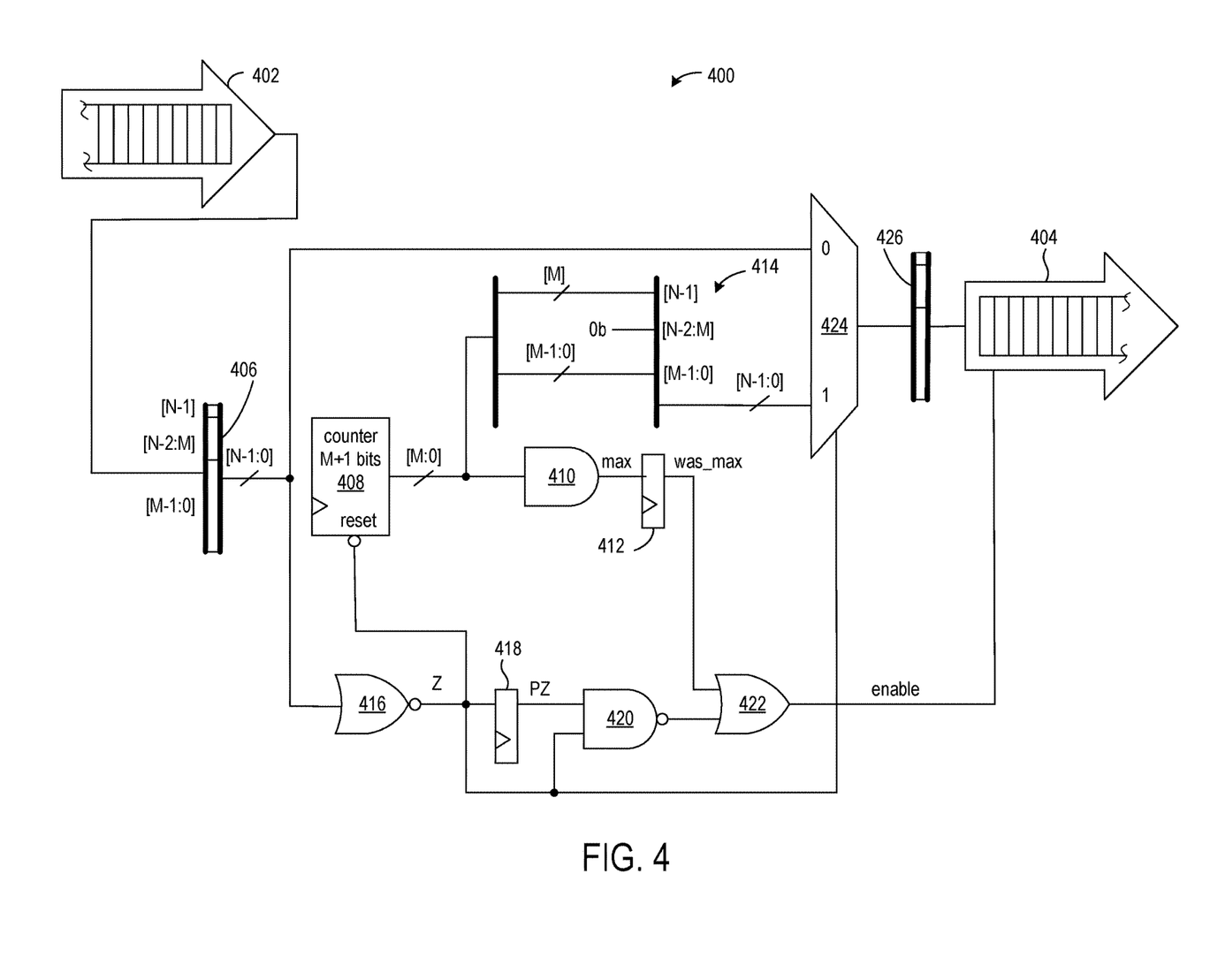
FIG. 4 shows an exemplary compression circuit for compressing floating point data.

FIG. 4 shows an exemplary compression circuit 400 for compressing floating point data. Input circuit 402 can provide a data set of floating point values to be compressed, and the output circuit 404 can provide the compressed data set. The input circuit and output circuit can be first-in-first-out (FIFO) buffers, direct memory access (DMA) circuits or a combination thereof.

According to an exemplary approach, an N-bit floating point value is provided by the input circuit 402 at each clock cycle and stored in register 406. The floating point value has M significand bits numbered 0 through M−1 of the N bits, N−(M+1) exponent bits numbered M through N−2 of the N bits, and one sign bit at bit N−1 of the N bits.

The exemplary circuit is a two-stage pipeline. A floating point value is input from the input circuit 402 and processed, creating an output in one cycle. However, output circuit is not enabled to receive the output value until the following cycle (or later) because the next input value(s) must be tested for a zero value.

The N-bit NOR gate 416 detects whether or not the value in register 406 is zero. The zero-value indicator is stored in register 418 so that the absence of zero in either the previous or current value can be detected by NAND gate 420 to enable provision of an output value in register 426 to the output circuit 404 by OR gate 422. The register 426 serves as a staging register for a value to be provided to the output circuit 404 when the output circuit is enabled. The output circuit is enabled to input the value from the staging register in response to the previous input value not being zero, the previous input value being zero and the current input value not being zero, or output of a maximum value from the counter 408. Though not illustrated, it will be recognized that the counter increments once every clock cycle, that is, as each floating point value is input to register 406.

The selection circuit 424 selects either the value from register 406 or a subnormal floating point value assembled from output of the counter 408, in response to the signal from NOR gate 416, which indicates whether or not the value in register 406 is zero. The selected value is stored in register 426. For a non-zero floating point value, the selection circuit 424 selects the value from register 406. For a zero value in register 406, the selection circuit 424 selects the assembled subnormal floating point value.

The assembled subnormal floating point value indicates a counted number of zero values in a sequence of consecutive zero values. Formatter circuitry 414 assembles the subnormal floating point value for input to the selection circuit 424.

The exponent bits (bits M:N−2) of the assembled subnormal floating point value are set to zero bits to indicate a subnormal value. The formatter circuitry routes bit M (the most significant bit) of the value from the counter to the sign bit (bit N−1) of the subnormal floating point value, and routes bits M−1:0 of the value from the counter to the significand bits M−1:0 of the subnormal floating point value. In an alternative embodiment, the counted number of zero values can be stored in only the significand bits and not the sign bit, and the counter would be only M bits wide. In the exemplary embodiment, the counted number is one less than the number of consecutive zeros in the sequence as counting begins at zero.

The counter 408, which is M+1 bits wide, starts counting from 0 when reset, and increments by one each clock cycle up to $2^{M+1}-1$. Once the counter reaches the maximum value ($2^{M+1}-1$), the counter begins counting from zero. The AND gate 410 (M+1 bits wide) detects when the counter has reached its maximum value, and an indicator bit is stored in register to signal that the maximum value has been reached. The output signal from register 412 is provided to OR gate 422, and if the maximum counter value was reached in the previous cycle, the output circuit 404 is enabled to receive the value in register 426. Thus, if there are more consecutive zeros than can be represented with M+1 bits, the maximum counter value is output and a new count begins. Consecutive subnormal floating point values that encode a sequence of consecutive input floating point zero values are generated in response to the counter 408 reaching its maximum value at least once and the last encoded sequence of the consecutive sequences followed by two or more consecutive floating point zero values in the input data set. That is, a long sequence of consecutive zeros (more than $2^{M+1}$ consecutive zeros), is encoded as multiple subnormal floating point values. The length of the encoded sequence of counted zeros in bits for N-bit floating point values is $N*\text{ceil}(\text{count}/2^{(M+1)})$.

A non-zero value in register 406 either ends a sequence or precludes beginning of a sequence and is detected by NOR gate 416. The signal from NOR gate 416 controls resetting the counter 408.

Figure 5:
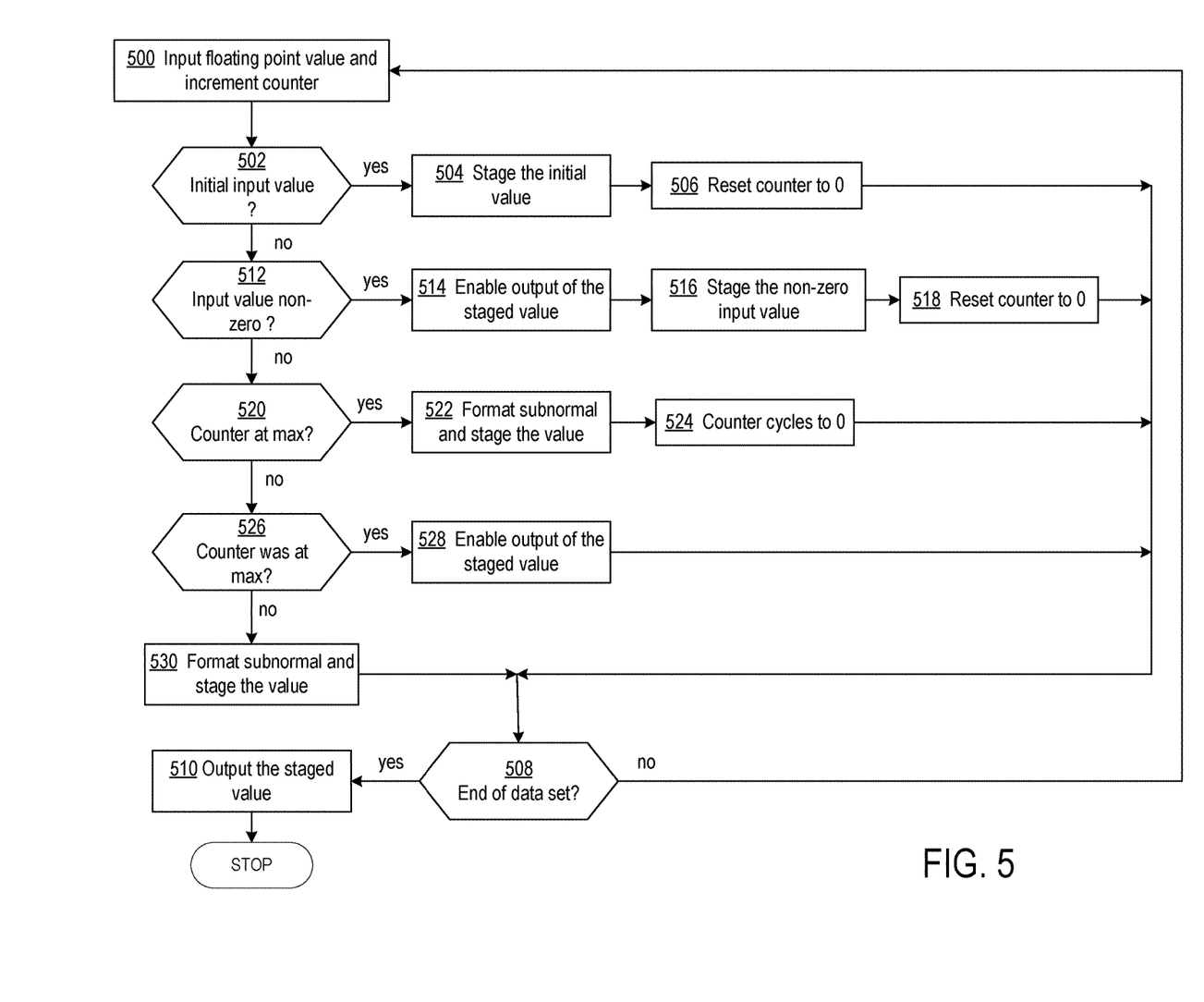
FIG. 5 is a flowchart of a process for compressing floating point data according to operation of the compression circuit of FIG. 4.

FIG. 5 is a flowchart of a process for compressing floating point data according to operation of the compression circuit of FIG. 4. At block 500, the compression circuit inputs a floating point value and increments the counter. At decision block 502, the compression circuit determines whether or not the input value is the first value in the data set. If so, at block 504 the compression circuit stores the value in the staging register (FIG. 4, #426) and resets the counter (FIG. 4, #408) at block 506. The compression circuit continues at decision block 508 to check for the end of the compressed data set. If the end of the data set has been reached, the compression circuit outputs the staged value at block 510 and stops. Otherwise, the compression circuit inputs another floating point value at block 500.

At decision block 512, the compression circuit determines whether or not the input value is a normal non-zero floating point value. If the value is non-zero, at block 514 the compression circuit enables output of the value in the staging register and stores the input non-zero value in the staging register at block 516. At block 518, the compression circuit resets the counter. The compression circuit continues at decision block 508 to check for the end of the compressed data set.

The compression circuit at decision block 520 determines whether or not the output of counter has reached the maximum value of the counter. If so, at block 522 the compression circuit formats a subnormal floating point value using the output value from the counter and stages the value in staging register. At block 524, the counter cycles back to 0. The compression circuit continues at decision block 508 to check for the end of the compressed data set.

At decision block 526, the compression circuit checks whether or not the counter reached the maximum value on the preceding input value. If so, at block 528 the compression circuit enables the output circuit to receive the value from the staging register. The compression circuit continues at decision block 508 to check for the end of the compressed data set.

If the counter had not reached the maximum value on the preceding input value, at block 530 the compression circuit formats a subnormal floating point value using the output value from the counter and stages the value in staging register. The compression circuit continues at decision block 508 to check for the end of the compressed data set.

Figure 6:
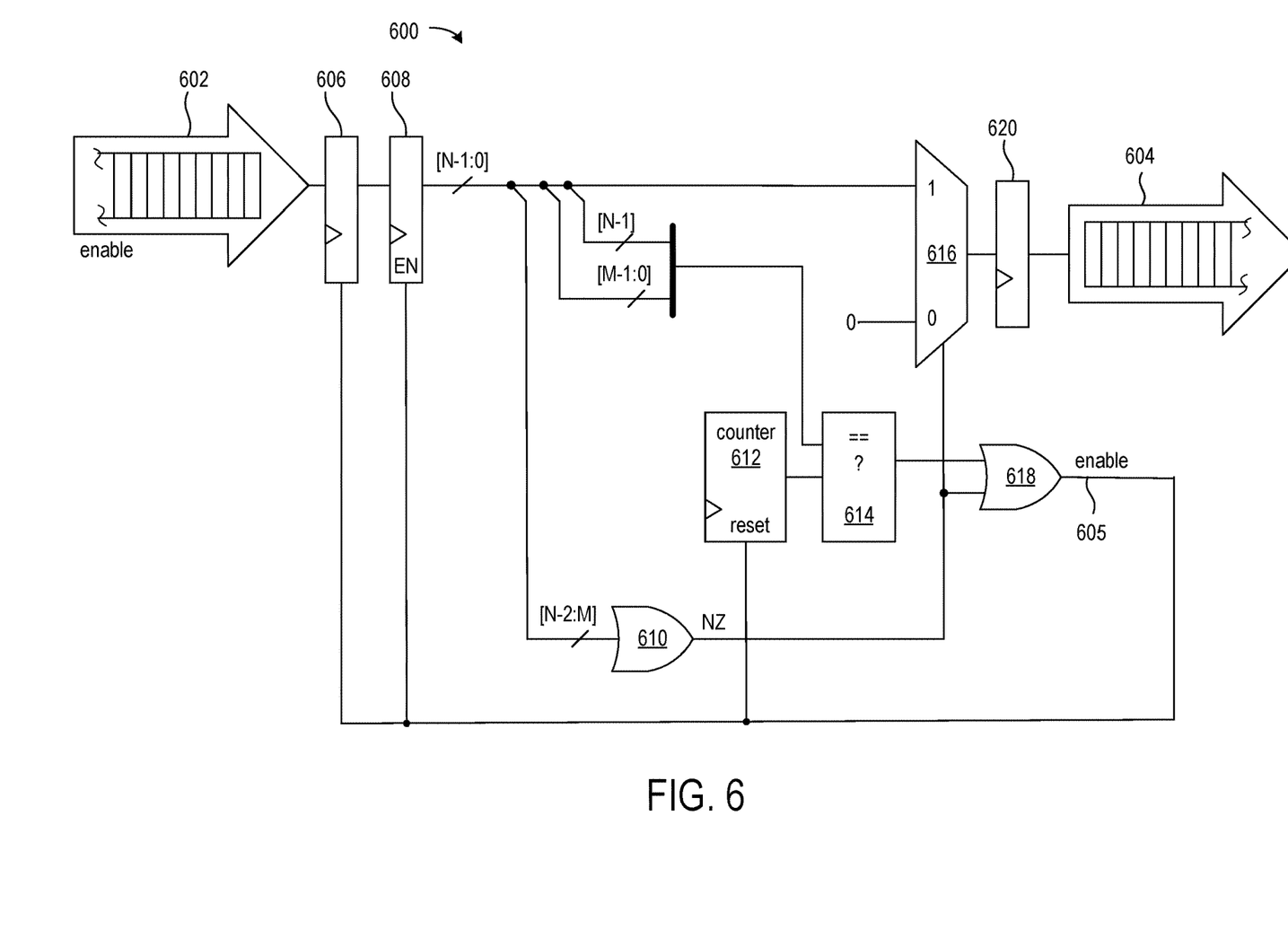
FIG. 6 shows an exemplary decompression circuit for decompressing floating point data.

FIG. 6 shows an exemplary decompression circuit 600 for decompressing floating point data. Input circuit 602 can provide a compressed data set of floating point values to be decompressed, and the output circuit 604 can provide the decompressed data set. The input circuit and output circuit can be first-in-first-out (FIFO) buffers, direct memory access (DMA) circuits or a combination thereof.

The decompression circuit provides an output value on every clock cycle. Registers 606 and 608 are connected to pipeline a current input value and a next input value to be processed, because the output can be a single zero floating point value or a non-zero floating point value. Registers 606 and 608 can be referred to as the next-value register and the current-value register, respectively.

The number of cycles consumed in processing the current input value depends on the current input value. Processing of a non-zero value consumes one cycle. If the current value is a subnormal value that represents a compressed sequence of zero values, the number of cycles consumed is one plus the value of the significand bits (and optionally sign bit).

The enable signal 605 advances the next value from register 606 to the current-value register 608 and enables loading of a new next value into next-value register 606 from the input circuit 602. The enable signal and remains high until a non-zero significand is detected in a subnormal value.

OR gate 610 inputs the exponent bits N−2:M of the floating point value from register 608 to detect a non-zero value. If a non-zero value is detected, selector circuit 616 selects the output from current-value register 608 for storing in register 620. If the value in current-value register 608 is not a non-zero value, the selector circuit 616 selects the N-bit constant value 0 for register 620.

The signal from OR gate 610 is input to 618 is input to OR gate 618, whereby a detected non-zero value causes reset of the counter circuit 612. When a zero value (normal or subnormal) is present in register 608, the output of counter is initially zero. The output of the counter is compared to the sign and significand bits (N−1 and M−1:0) of the value in register 608 by comparator circuit 614. Floating point zero values are selected for output to the register 620 until the counter value is equal to the value of the sign and significand bits. The output signal from comparator circuit 614 is input to OR gate 618, whereby in response to the output of the counter being equal to the value of the sign and significand bits, the enable signal 605 is asserted, causing reset of the counter, forwarding of the value from register 606 to register 608, and input of the next value to register 606. Though not illustrated, it will be recognized that the counter increments once every clock cycle.

Figure 7:
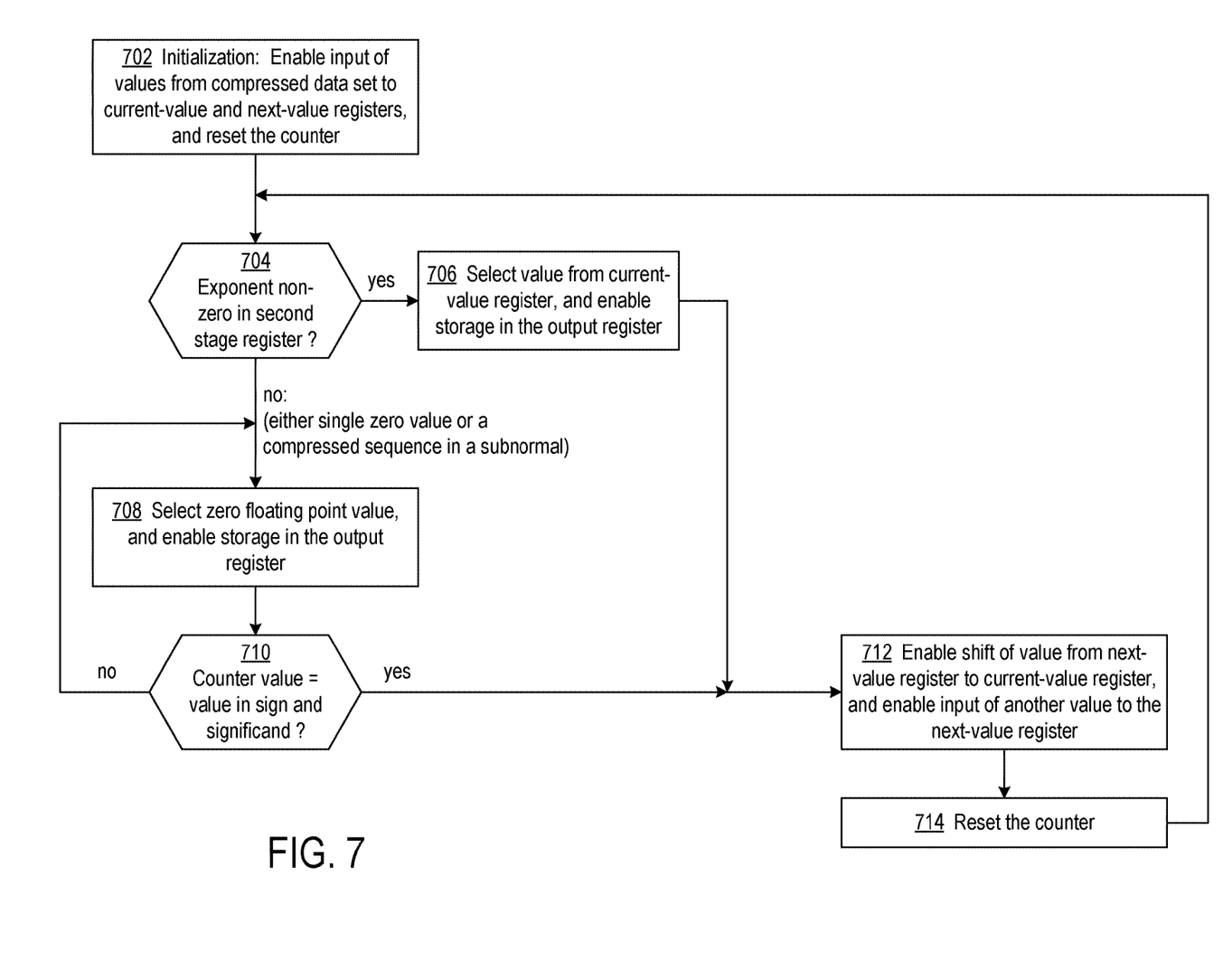
FIG. 7 is a flowchart of a process for decompressing compressed floating point data according to operation of the decompression circuit of FIG. 6.

FIG. 7 is a flowchart of a process for decompressing compressed floating point data according to operation of the decompression circuit of FIG. 6. At block 702, the decompression circuit initializes by enabling input of two floating point values from the compressed data set to the current-value and next-value registers and resetting the counter.

At decision block 704, the decompression circuit determines whether or not any of the exponent bits of the value in the current-value register are non-zero. If so, at block 706 the decompression circuit selects the value from current-value register and enables storage of the selected value in the output register (FIG. 6, #620). The counter increments as each value is input to the output register, that is once every clock cycle. The decompression circuit continues at block 712 by enabling a shift of the value from the next-value register to the current-value register and enabling input of another value to the next-value register. At block 714, the decompression circuit resets the counter.

In response to the exponent bits all being zero, which indicates either a single zero value or a subnormal value that represents a compressed sequence of zero values, at block 708 the decompression circuit selects the constant zero floating point value and enable storage of the zero value in the output register. The counter increments as each value is input to the output register, that is once every clock cycle.

At decision block 710, the decompression circuit compares the output value from the counter to the value indicated by the sign and significand bits of the value in the current-value register. If the counter has not reached the value indicated by the sign and significand bits, the decompression circuit returns to block 708 to again select a zero floating point value for output. Otherwise, the decompression circuit continues at block 712 and 714 as described above.

Figure 8:
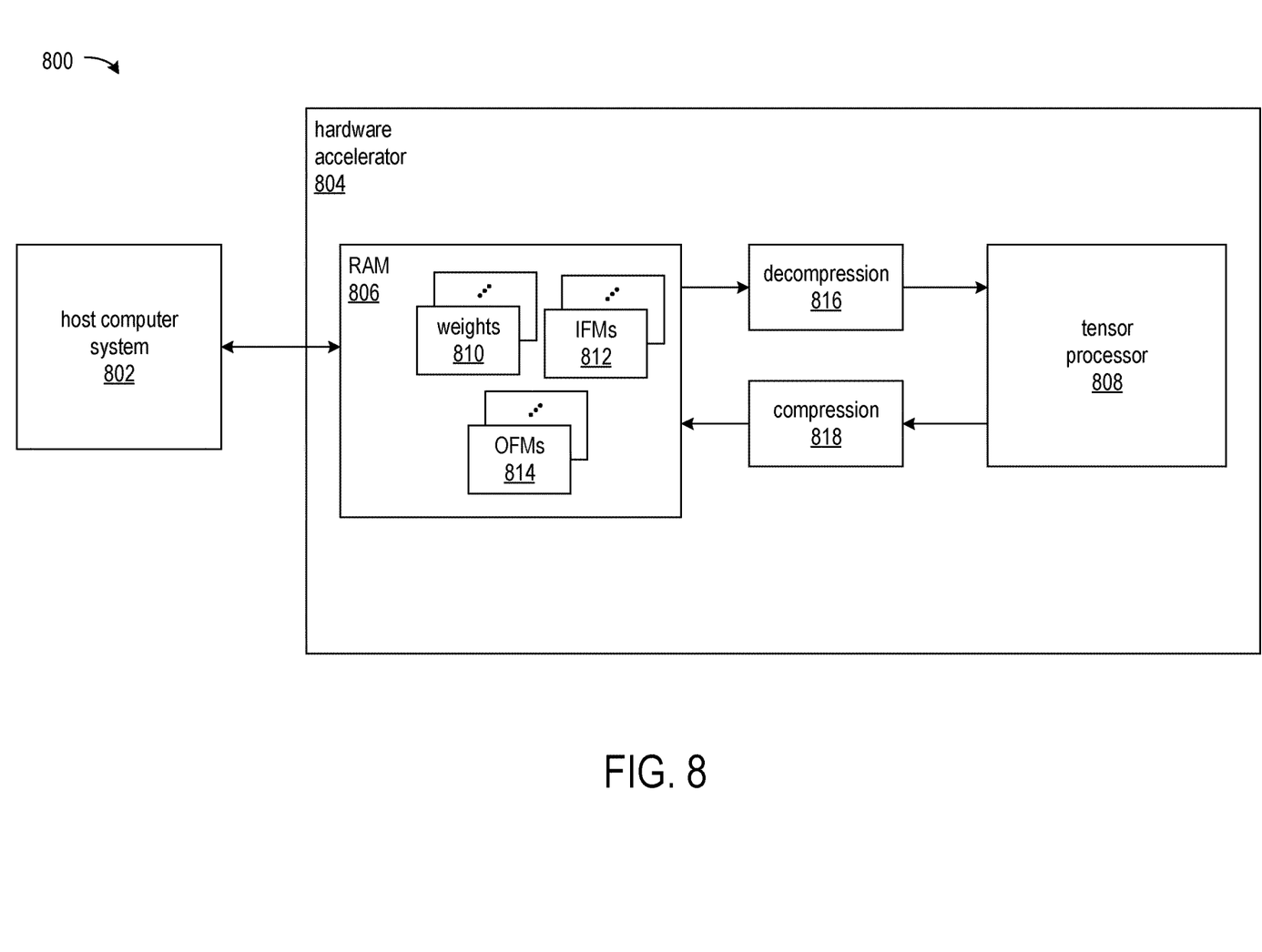
FIG. 8 is a block diagram of a system having compression and decompression circuitry coupled between a tensor processor and a memory arrangement.

FIG. 8 is a block diagram of a system 800 having compression and decompression circuitry coupled between a tensor processor and a memory arrangement from which the tensor processor inputs floating point data to process and to which the tensor processor writes output feature maps of floating point data. The system 800 includes a host computer system 802 communicatively coupled to a hardware accelerator 804. The host computer system and hardware accelerator can be components of a system-on-chip (SoC) or a system-in-package (SiP), or components on multiple circuit boards. Though not shown, it will be recognized that the system can include support circuits that manage data flow between the host computer system 802 and the hardware accelerator. For example, a peripheral bus can implement an expansion bus standard, such as Peripheral Component Interconnect Express (PCIe).

The host computer system 802 can execute neural network applications (not shown) that access acceleration libraries (not shown) for interfacing to the hardware accelerator 804. The neural network applications can be implemented by way of neural network frameworks and libraries, such as Caffe, TensorFlow™, MXNet, and the like. The host computer system can direct the hardware accelerator to perform neural network functions, including predefined and optimized implementations of neural network layers and other types of neural network structures by the tensor processor 808.

In an example, the hardware accelerator 804 includes programmable integrated circuits (ICs), such as field programmable gate arrays (FPGAs) and RAM 806. The RAM can include DDR DRAM or the like.

The hardware accelerator is 804 is configured with a tensor processor 808. The tensor processor can be configured to perform functions such as image-to-column (IM2COL) formatting, tensor multiplication, rectified linear unit (ReLU) scaling, and pooling in support of implementing a neural network. The inputs to the tensor processor include weights and input feature maps (IFMs), and the output generated by the tensor processor include output feature maps (OFMs).

In order to enable reading from and writing to the RAM 806 at the rate at which the tensor processor 808 can consume and generate data, and to reduce storage requirements, the decompression circuit 816 and compression circuit 818 are coupled between the tensor processor and the RAM.

The weights 810, IFMs 812, and OFMs 814 are floating point data sets in which sequences of zero value have been compressed by using subnormal floating point values as described above. The OFMs produced by the tensor processor in performing the functions of one layer of a neural network can become IFMs for processing in the next layer of the neural network by the tensor processor.

The compressed floating point data sets of the weights 810 and IFMs 812 from the RAM 806 are passed through the decompression circuit 816 for processing by the tensor processor. The decompression circuit decompresses the data sets, expanding subnormal floating point values found in the compressed data sets into sequences of zero floating point values as described above.

The tensor processor processes the decompressed data sets and produces OFMs for further processing in subsequent neural network layer or as final output. The floating point values of OFMs are passed through the compression circuit 818 on the way to storage in the RAM 806. The compression circuit compresses the OFMs by replacing each sequence of zero values with a subnormal floating point value as described above.

Additional instances (not shown) of the compression and decompression circuits can be configured on the hardware accelerator to support additional tensor processors and/or to provide an interface between the host computer system and the RAM 806.

Figure 9:
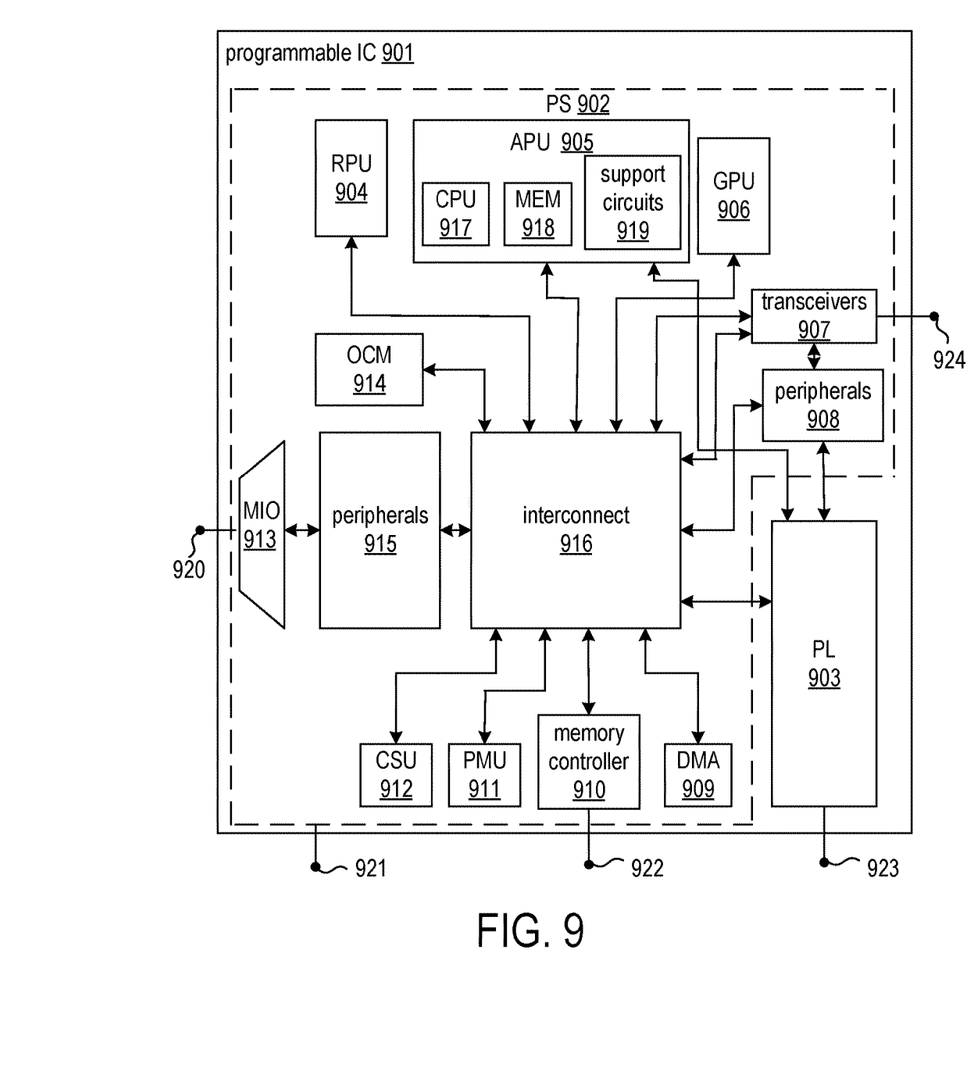
FIG. 9 is a block diagram depicting a System-on-Chip (SoC) that can host the disclosed compression and decompression circuits, as well as a tensor processor according to an example.

FIG. 9 is a block diagram depicting a System-on-Chip (SoC) 901 that can host the disclosed compression and decompression circuits, as well as a tensor processor according to an example. In the example, the SoC includes the processing subsystem (PS) 902 and the programmable logic subsystem 903. The processing subsystem 902 includes various processing units, such as a real-time processing unit (RPU) 904, an application processing unit (APU) 905, a graphics processing unit (GPU) 906, a configuration and security unit (CSU) 912, and a platform management unit (PMU) 911. The PS 902 also includes various support circuits, such as on-chip memory (OCM) 914, transceivers 907, peripherals 908, interconnect 916, DMA circuit 909, memory controller 910, peripherals 915, and multiplexed (MIO) circuit 913. The processing units and the support circuits are interconnected by the interconnect 916. The PL subsystem 903 is also coupled to the interconnect 916. The transceivers 907 are coupled to external pins 924. The PL 903 is coupled to external pins 923. The memory controller 910 is coupled to external pins 922. The MIO 913 is coupled to external pins 920. The PS 902 is generally coupled to external pins 921. The APU 905 can include a CPU 917, memory 918, and support circuits 919. The APU 905 can include other circuitry, including L1 and L2 caches and the like. The RPU 904 can include additional circuitry, such as L1 caches and the like. The interconnect 916 can include cache-coherent interconnect or the like.

Referring to the PS 902, each of the processing units includes one or more central processing units (CPUs) and associated circuits, such as memories, interrupt controllers, direct memory access (DMA) controllers, memory management units (MMUs), floating point units (FPUs), and the like. The interconnect 916 includes various switches, busses, communication links, and the like configured to interconnect the processing units, as well as interconnect the other components in the PS 902 to the processing units.

The OCM 914 includes one or more RAM modules, which can be distributed throughout the PS 902. For example, the OCM 914 can include battery backed RAM (BBRAM), tightly coupled memory (TCM), and the like. The memory controller 910 can include a DRAM interface for accessing external DRAM. The peripherals 908, 915 can include one or more components that provide an interface to the PS 902. For example, the peripherals can include a graphics processing unit (GPU), a display interface (e.g., DisplayPort, high-definition multimedia interface (HDMI) port, etc.), universal serial bus (USB) ports, Ethernet ports, universal asynchronous transceiver (UART) ports, serial peripheral interface (SPI) ports, general purpose (GPIO) ports, serial advanced technology attachment (SATA) ports, PCIe ports, and the like. The peripherals 915 can be coupled to the MIO 913. The peripherals 908 can be coupled to the transceivers 907. The transceivers 907 can include serializer/deserializer (SERDES) circuits, MGTs, and the like.

Those skilled in the art will appreciate that various alternative computing arrangements, including one or more processors and a memory arrangement configured with program code, would be suitable for hosting the processes and data structures disclosed herein. In addition, the processes may be provided via a variety of computer-readable storage media or delivery channels such as magnetic or optical disks or tapes, electronic storage devices, or as application services over a network.

Though aspects and features may in some cases be described in individual figures, it will be appreciated that features from one figure can be combined with features of another figure even though the combination is not explicitly shown or explicitly described as a combination.

The circuits and methods are thought to be applicable to a variety of systems for compressing and decompressing floating point data sets. Other aspects and features will be apparent to those skilled in the art from consideration of the specification. The circuits and methods may be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:

1. A circuit arrangement comprising:
   a first input circuit configured to input a data set of floating point values;
   a first detection circuit configured to detect non-zero floating point values, sequences of zero floating point values, and ends of the sequences in the data set from the first input circuit;
   a first counter configured to count a number of zero floating point values in each sequence of zero floating point values and output the number;
   a formatter circuit configured to provide a subnormal floating point value having significand bits that represent the number output from the first counter; and
   a first selection circuit configured to provide a compressed data set by selection of each non-zero floating point value for output in response to detection of the non-zero floating point value, and selection of the subnormal floating point value for output in response to an end of the ends of the sequences.

2. The circuit arrangement of claim 1, wherein the formatter circuit is configured to provide the subnormal floating point value having a sign bit and the significand bits that represent the number output from the first counter.

3. The circuit arrangement of claim 1, further comprising:
   a tensor processor coupled to the first input circuit, wherein the tensor processor is configured to:
      generate output feature maps from tensor operations performed on input feature maps and weights specified as tensors, and
      provide the output feature maps as the data set of floating point values to the first input circuit.

4. The circuit arrangement of claim 3, further comprising:
   a memory arrangement coupled to the first selection circuit for storing the compressed data set; and
   a decompression circuit coupled between the tensor processor and the memory arrangement and configured to:
      decompress compressed data from the memory arrangement into the input feature maps and weights, and
      provide the input feature maps and weights to the tensor processor.

5. The circuit arrangement of claim 4, wherein the decompression circuit includes:
   a second input circuit configured to input the compressed data;
   a second detection circuit configured to detect non-zero floating point values and floating point values having zero-value exponents in the compressed data; and
   a second selection circuit configured to provide a decompressed data set for output by:
      selection of a non-zero floating point value for output in response to detection of the non-zero floating point value, and
      selection of a sequence of N zero floating point values in response to a floating point value having a zero-value exponent, wherein N is a function of a value of the significand bits in the floating point value having a zero-value exponent.

6. The circuit arrangement of claim 1, further comprising:
   a memory arrangement coupled to the first selection circuit for storing the compressed data set; and
   a decompression circuit coupled to the memory arrangement and configured to decompress the compressed data set.

7. The circuit arrangement of claim 6, wherein the decompression circuit includes:
   a second input circuit configured to input the compressed data;
   a second detection circuit configured to detect non-zero floating point values and floating point values having zero-value exponents in the compressed data; and
   a second selection circuit configured to provide a decompressed data set for output by:
      selection of a non-zero floating point value for output in response to detection of the non-zero floating point value, and
      selection of a sequence of N zero floating point values for output in response to a floating point value having a zero-value exponent, wherein N is a function of a value of the significand bits in the floating point value having a zero-value exponent.

8. The circuit arrangement of claim 1, further comprising:
   a circuit configured to detect a maximum value output from the first counter; and
   wherein the first selection circuit is configured to select the subnormal floating point value for output in response to detecting output of the maximum value from the first counter.

9. The circuit arrangement of claim 8, further comprising:
wherein the first input circuit includes an input register configured to store a current input value;
wherein the first detection circuit includes a previous-zero register configured to store a value that indicates whether or not a zero value is detected in the input register;
an output circuit;
a staging register configured for storage of each value selected by the first selection circuit; and
a control circuit configured to enable the output circuit to input a value from the staging register in response to the previous-zero register indicating a non-zero value, the previous-zero register indicating a zero value and the current input value not being zero, or output of a maximum value from the first counter.

10. The circuit arrangement of claim 1, further comprising:
wherein the first input circuit includes an input register configured to store a current input value;
wherein the first detection circuit includes a previous-zero register configured to store a value that indicates whether or not a zero value is detected in the input register;
an output circuit;
a staging register configured for storage of each value selected by the first selection circuit; and
a control circuit configured to enable the output circuit to input a value from the staging register in response to the previous-zero register indicating a non-zero value, or the previous-zero register indicating a zero value and the current input value not being zero.

11. A method comprising:
inputting a data set of floating point values from an input circuit to a compression circuit;
detecting non-zero values and sequences of zero values in the data set by the compression circuit;
outputting, in response to detection of a non-zero value in the data set, the non-zero value from the compression circuit to an output circuit; and
generating, in response to detection of a sequence of zero values in the data set, a subnormal floating point value having significand bits that indicate counted zero values in the sequence, and outputting the subnormal floating point value from the compression circuit to the output circuit.

12. The method of claim 11, wherein the generating includes generating the subnormal floating point value having a sign bit and the significand bits that indicate counted zero values in the sequence.

13. The method of claim 11, further comprising:
generating output feature maps by a tensor processor from tensor operations performed on input feature maps and weights specified as tensors; and
providing the output feature maps as the data set of floating point values to the compression circuit.

14. The method of claim 13, further comprising:
storing output from the compression circuit as compressed data in a memory arrangement;
decompressing compressed data from the memory arrangement into the input feature maps and weights by a decompression circuit; and
providing the input feature maps and weights to the tensor processor by the decompression circuit.

15. The method of claim 14, further comprising:
inputting the compressed data to the decompression circuit;
detecting non-zero floating point values and floating point values having zero-value exponents in the compressed data by the decompression circuit; and
providing a decompressed data set for output by the decompression circuit, the providing including:
selecting a non-zero floating point value for output in response to detection of the non-zero floating point value, and
selecting a sequence of N zero floating point values in response to a floating point value having a zero-value exponent, wherein N is a function of a value of the significand bits in the floating point value having a zero-value exponent.

16. The method of claim 11, further comprising:
storing output from the compression circuit as compressed data in a memory arrangement;
inputting the compressed data to a decompression circuit from the memory arrangement; and
decompressing the compressed data by the decompression circuit.

17. The method of claim 16, further comprising:
detecting non-zero floating point values and floating point values having zero-value exponents in the compressed data by the decompression circuit; and
providing a decompressed data set by the decompression circuit for output, the providing including:
selecting a non-zero floating point value for output in response to detection of the non-zero floating point value, and
selecting a sequence of N zero floating point values for output in response to a floating point value having a zero-value exponent, wherein N is a function of a value of the significand bits in the floating point value having a zero-value exponent.

18. The method of claim 11, further comprising:
counting a number of zero floating point values in each sequence of zero floating point values by a counter circuit;
detecting a maximum value output from the counter circuit; and
selecting the subnormal floating point value for output in response to detecting output of the maximum value from the counter circuit.

19. The method of claim 18, further comprising generating consecutive subnormal floating point values that encode a sequence of consecutive zero values in response to the counter circuit reaching the maximum value at least once and the number of zero floating point values in the sequence being at least two greater than the maximum value.

20. The method of claim 18, further comprising:
storing a current input value of the data set in an input register;
storing a value that indicates whether or not a zero value is detected in the input register in a previous-zero register;
staging each non-zero floating point value and each the subnormal floating point value in a register prior to output; and
enabling an output circuit to input a value from the register in response to the previous-zero register indicating a non-zero value, the previous-zero register indicating a zero value and the input register having a non-zero value, or output of a maximum value from the counter circuit.

* * * * *